(12) United States Patent
Alvandpour

(10) Patent No.: US 6,690,205 B2
(45) Date of Patent: Feb. 10, 2004

(54) ENHANCED DOMINO CIRCUIT

(75) Inventor: Atila Alvandpour, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/283,933

(22) Filed: Oct. 29, 2002

(65) Prior Publication Data

US 2003/0052714 A1 Mar. 20, 2003

Related U.S. Application Data

(63) Continuation of application No. 09/846,519, filed on Apr. 30, 2001, now Pat. No. 6,498,514.

(51) Int. Cl.[7] ............................................. H03K 19/01
(52) U.S. Cl. ............................... 326/98; 326/93; 326/95
(58) Field of Search ........................................ 326/93–98

(56) References Cited

U.S. PATENT DOCUMENTS 5,825,208 A  * 10/1998  Levy et al. .................... 326/98

* cited by examiner

*Primary Examiner*—Anh Tran
(74) *Attorney, Agent, or Firm*—Fish & Richardson P.C.

(57) ABSTRACT

A domino logic circuit contained within an integrated circuit includes a dynamic logic circuit and an intermediate logic circuit. The intermediate logic circuit includes a pull-up transistor having a source terminal coupled to a source voltage line and an n-block transistor having a source terminal connected to a low ground voltage line.

12 Claims, 3 Drawing Sheets

ENHANCED DOMINO CIRCUIT

CLAIM OF PRIORITY

This application is a continuation and claims priority under 35 USC §120 to U.S. patent application Ser. No. 09/846,519, now U.S. Pat. No. 6,498,514, filed on Apr. 30, 2001, the entire contents of which are hereby incorporated by reference.

TECHNICAL FIELD

This invention relates to domino circuits.

BACKGROUND

Traditional domino-CMOS logic circuits include 'dynamic' and 'static' logic blocks. The 'dynamic' blocks include n-channel gates which are first pre-charged and then perform logical functions during an evaluation phase. The output of the dynamic gates is input to a 'static' block, typically a CMOS inverter. To utilize the time dissipated by the CMOS inverter, the static block may be replaced by other static CMOS gates or by a block of pseudo-NMOS logic. Each replacement circuit has potential drawbacks in terms of the overall speed and power consumption of the domino-CMOS circuit.

DESCRIPTION OF DRAWINGS

Like reference symbols in the various drawings indicate like elements.

DETAILED DESCRIPTION

As used herein, 'N-block' refers to a circuit which includes one or more n-channel transistors.

Figure 1:
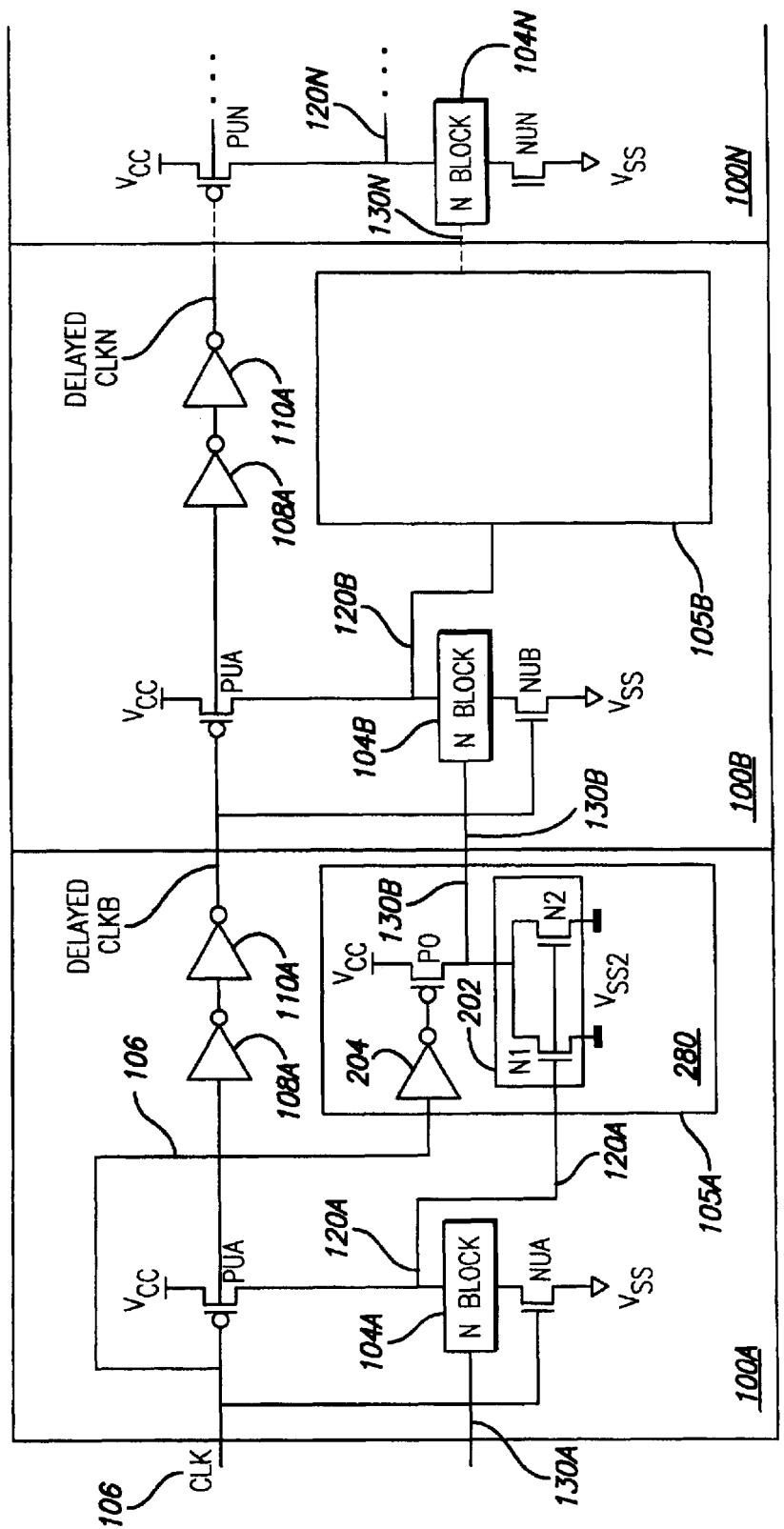
FIG. 1 is a schematic representation of a first embodiment of a domino circuit.

Referring to FIG. 1, circuit 100 includes a series of domino circuits 100A–100N. Each domino circuit 100A–100N includes an intermediate logic block 105A–105N. One or more of the intermediate logic blocks, 105A–105N, may be implemented as a CMOS circuit or a pseudo-NMOS circuit. In an embodiment, according to the invention, intermediate logic block 105A includes enhanced pseudo-NMOS logic circuit 280.

Each domino circuit 100A–100N includes one or more dynamic logic gates, represented by N-Block 104A–104N. N-Block 104A–104N gates alternate between pre-charge and evaluation phases, according to signal CLK 106 and DELAYED CLK B–N, respectively. N-block 104A–104N gates evaluate input 130A–130N signals only during the respective evaluation phases of each domino circuit 100A–100N. For example, consider the operation of domino circuit 100A: in the pre-charge phase, CLK 106 is '0', PUA turns on, pre-charging ('pulling up') the output 120A to '1'. During the evaluation phase, CLK 106 goes to '1', PUA is turned off, and the output 120A is either discharged to '0', or, left at '1' depending on the evaluation of input 130A signal by N-block 104A.

Domino circuit 100A–100N may also include n-channel transistor NUA-NUN, connected in series with the N-blocks 104A–104N. In operation, transistor NUA-NUN is turned off during the pre-charge phase (CLK 106 at '0'), therefore reducing the power dissipation of the N-block 104A–104N transistors.

Circuit 100 includes domino circuits 100A–100N, where each domino circuit is connected to the succeeding domino circuit. The CLK 106 signal is connected a series of inverter pairs, 108A–108N and 100A–100N, to provide a DELAYED CLK B–N for the pre-charge and evaluation phases of each succeeding domino circuit 100B–100N. For example, inverters 108A and 110A provides a sufficient time delay for domino circuit 100A to evaluate and propagate signals to the input 130B of dynamic N-Block 104B before DELAYED CLK B begins the evaluation phase in domino circuit 100B.

In an embodiment, according to the invention, intermediate logic block (ILB) 105A is implemented as enhanced pseudo-NMOS logic circuit 280. Circuit 280 includes inverter 204, p-channel transistor P0, N-block 202, input 120A, output 130B, Vcc and Vss2. The configuration of P0 and N-block 202 is similar to the configuration of dynamic logic blocks 104A–104N as discussed above, however, since the input of P0 is connected to the output of inverter 204, P0 will be off during the pre-charge phase of N-block 104A (when CLK 106 is '0'). By turning P0 off during the pre-charge phase, the D.C. power consumption of circuit 280 is significantly reduced, that is, circuit 280 only dissipates D.C. power conditionally when N-Block 202 transistors are turned on and evaluating input 120A. As shown, N-Block 202 includes transistors N1 and N2, with both N1 and N2 connected at their gate terminals to input 120A. This configuration of N-Block 202 is an example to help explain the operation of circuit 280, other N-Block 202 gate configurations are possible, and other inputs to the N-Block 202 transistors are possible.

Referring to circuit 280, during the pre-charge phase, CLK 106 is '0', PUA is on and output 120A is pulled-up to '1'. Since 120A is connected to the input of N-Block 202 transistors of circuit 280, N1 and N2 are turned on, pulling-down output 130B to '0'. CLK 106 '0' is input to inverter 204, which outputs a '1' to P0, turning P0 off, which substantially blocks the D.C. current flow through N-Block 202 transistors during the pre-charge phase. In the evaluation phase, CLK 106 goes to '1', turning off PUA, and allowing N-Block 104A to evaluate INPUT 130A signal. Output 120A is either held at '1', or pulled-down to '0' by N-Block 104A depending on the INPUT 130A signal. The '1' at CLK 106 is input to inverter 204, which outputs a '0' to P0, turning on P0 so that P0 is ready to pull-up output 130B depending on the evaluation of input 120A by N-Block 202 transistors. If 120A stays at '1' N-Block 202 transistors N1 and N2 stay on, therefore output 130B remains pulled-down to '0'. If 120A goes to '0', N-block 202 transistors N1 and N2 turn off, allowing P0 to pull-up the output 130B to '1'.

As described above, the control signal for turning transistor P0 off and on is derived from the inverted 204 CLK 106 signal. In an alternate embodiment, the control signal to P0 could be generated from other control circuitry, as long as the control signal is derived with reference to the CLK 106 signal or the evaluation phases of N-Block 104A.

Circuit 280 also includes a connection to Vcc, the source voltage, and connections to a "low-ground", Vss2, which represents a voltage level below the common ground of the circuit, Vss. The benefit of providing Vss2 to the source terminals of N-Block 202 can be explained with reference to operation of a traditional pseudo NMOS circuit.

Figure 2:
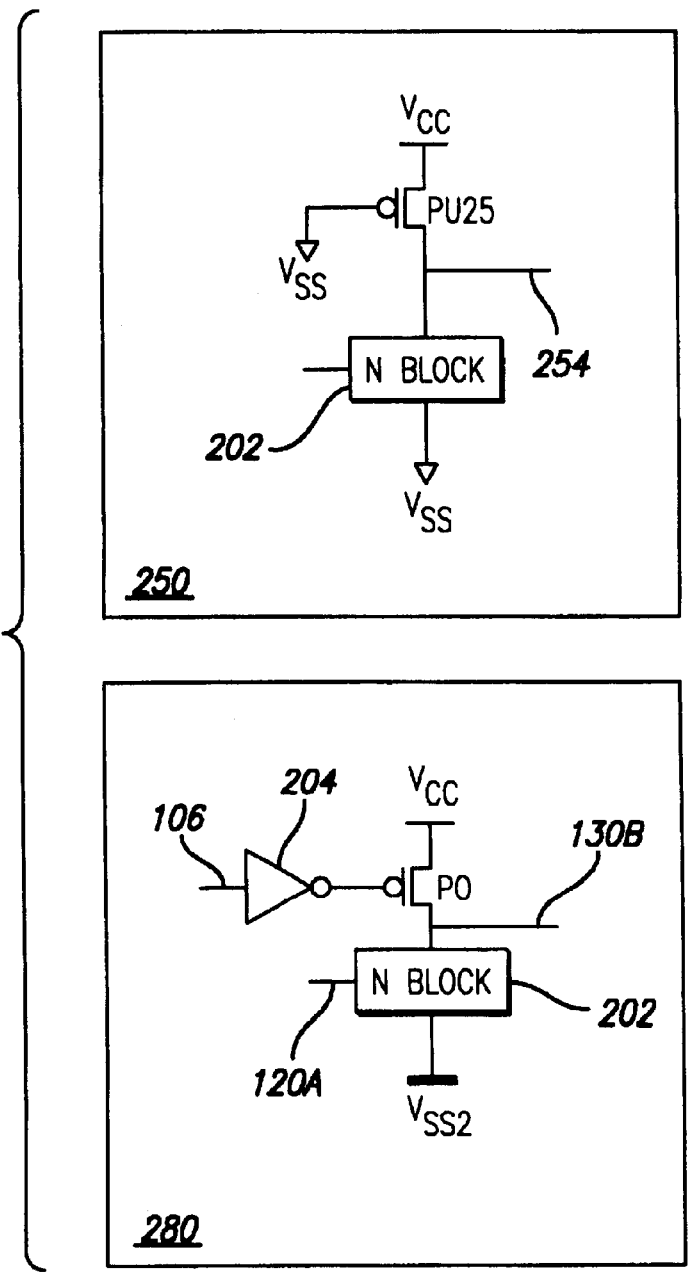
FIG. 2 is a schematic representation of a traditional pseudo-NMOS gate and an enhanced pseudo-NMOS gate.

Referring to FIG. 2, traditional pseudo-NMOS circuit 250, which includes a connection to Vss at the source terminals of N-block 202, is shown. Pseudo-NMOS circuits are referred to as 'ratio-logic', where the device sizes (the width to length ratio) of the p-channel transistor and the n-channel transistors are 'sized' for proper operation of the circuit. Referring to traditional pseudo-NMOS circuit 250, the pull-up device PU25 has to be significantly weaker (down-sized) than the pull-down network 202 in order for the pull-down network 202 to produce an output 254 logic 'low' that is sufficiently close to Vss. The down-sizing of pull-up device PU25 increases the time required to pull-up the output 254 during a 'low'-to-'high' transition and reduces the overall speed of circuit 250.

In enhanced pseudo-NMOS logic circuit 280, because the source terminals of the N-Block 202 transistors are connected to Vss2, an output 130B 'low' is produced that is sufficiently close to Vss but without requiring a significant down-sizing of pull-up device P0. In both circuit 250 and 280, when both the pull-up and pull-down networks are "ON", they are effectively acting as two serially connected resistances between Vcc and Vss in circuit 250, and between Vcc and Vss2 in circuit 280. As a result, using the same device sizes in circuit 250 and 280, and with reference to common ground Vss, the voltage level produced at the output 130B of circuit 280 at a logic 'low', is at a lower level than can be produced at output 254 of circuit 250.

The lower voltage level for logic 'LOW' at output 130B can be utilized in two different ways. First, dynamic logic gates, such as gates 104A–104N (FIG. 1) have a small input-'LOW' dc-noise margin. If the output 130B is connected to the input of another dynamic logic block, such as 104B, the dc-noise level input to the dynamic gate 104B is reduced. Second, if the voltage level for the output 'low' 130B is the same as that of the traditional pseudo-NMOS gate 250, then the pull-up device PU0 in 280 can be sized larger than the pull-up device PU25 in 250. This allows circuit 280 to produce faster output 'low'-to-'high' transitions and an increase in the overall speed of circuit.

When utilizing a low ground Vss2, the source-to-bulk PN junctions of the N-block 202 devices are in forward bias. The operation of circuit 280 is achieved by providing the absolute value of Vss2 as large as possible but without exceeding the source-to-bulk PN-junction's turn-on voltage of the N-Block 202 transistors being used. Using n-channel transistors made from silicon, which have a diode turn-on voltage of approximately 0.5V, Vss2 can be provided as near as possible to −0.5V. However, providing Vss2 as any voltage lower than Vss without exceeding the diode turn-on voltage will also improve the operation of circuit 280.

Figure 3:
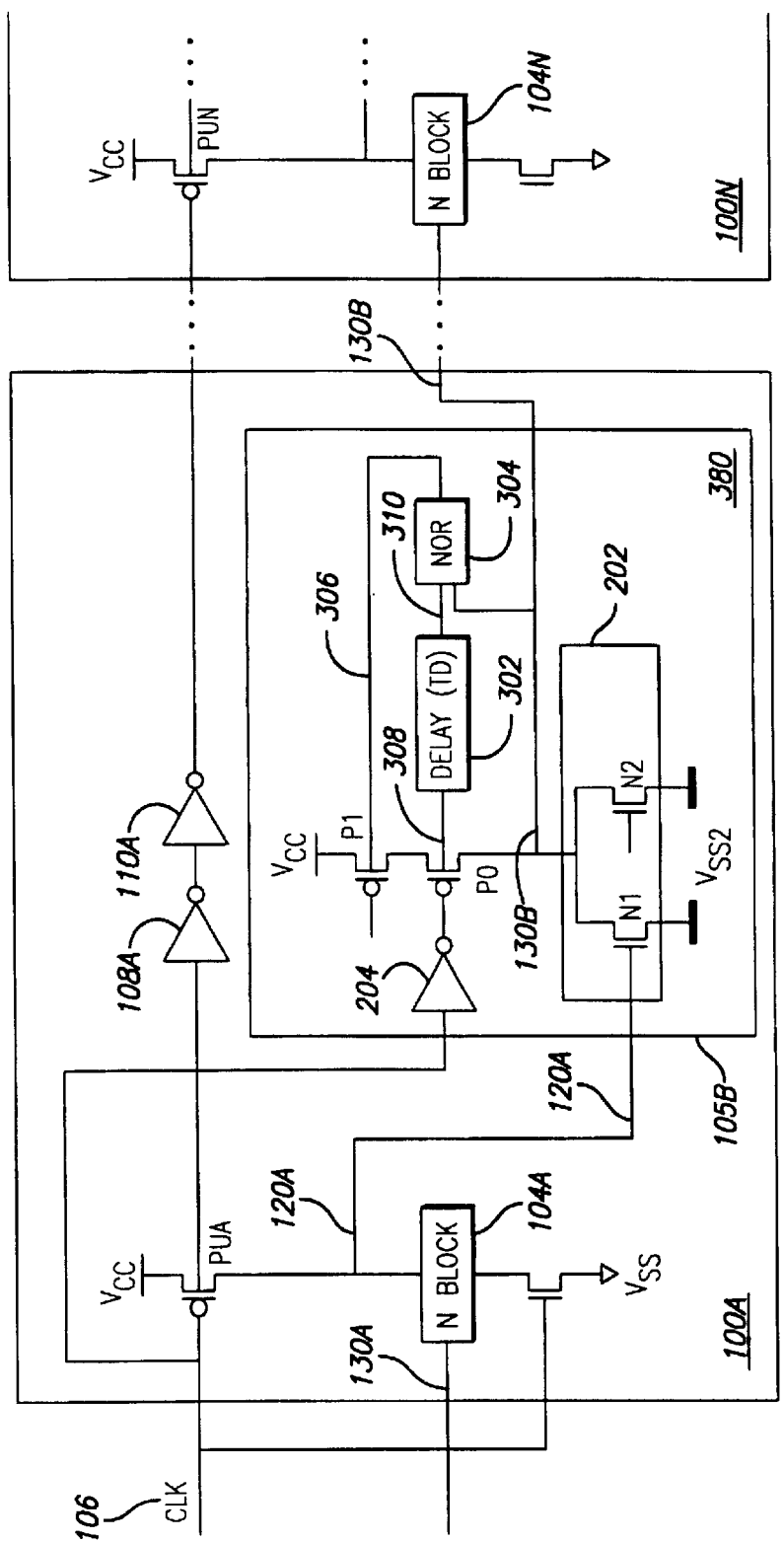
FIG. 3 is a schematic representation of a second embodiment of a domino circuit.

Referring to FIG. 3, in another embodiment of circuit 100, enhanced pseudo-Nmos circuit 380 is included in intermediate logic block (ILB) 105A. Circuit 380 differs from circuit 280 (FIG. 1) by the addition of a Delay element 302, CMOS NOR gate 304 and p-channel transistor P1. The additional circuit elements 302, 304 and P1 reduce power consumption of the 380 circuit by shortening the evaluation period of N-Block 202 and therefore reducing the time for D.C. current to flow through the N-Block 202 transistors, as will be explained.

In operation, during the pre-charge phase, CLK 106 is '0', inverter 204 outputs a '1' to P0, turning P0 off. P0 outputs 308 the '1' to Delay element 302, after time Td, the '1' is input 310 to NOR gate 304, which outputs 306 a '0' to P1, turning on P1. CLK 106 at '0' also turns on PUA, PUA pulls-up output 120A to '1', which is input to N-Block 202, turning on N1 and N2, which pulls down output 130B to '0'. Therefore, at the end of the pre-charge phase the inputs to NOR gate 304 are '1' (310) and '0' (130B), and the NOR gate 304 output 306 is '0', keeping P1 on. During the evaluation phase, CLK 106 goes to '1', turning on P0, and inputting 308 a '0' to Delay element 302. Now P0 and P1 are both on, and ready to pull-up output 130B of N-Block 202. N-Block 202 transistors can now evaluate input 120A from the previous dynamic block 104A. If N1 and N2 stay on, output 130B stays at '0', and after time Td, the '0' from 308 is input 310 to NOR gate 304, producing a '1' at 306, turning off P1, and substantially cutting off D.C. power dissipation in N-Block 202. In the opposite case, input 120A goes to '0', turning off N1 and N2, output 130B is pulled up to '1' by P0 and P1, the '1' at 130B is input to NOR gate 304 causing NOR gate output 306 to stay at '0', keeping P1 on, which together with P0, continue to pull-up output 130B to '1'.

The delay element 302 may be configured in any manner which provides a delay time, Td, which is at least as long as the worst-case evaluation time of N-Block 104A plus the worst-case evaluation time of N-Block 202.

The D.C. power consumption of circuit 280 and 380 could be further reduced by providing a pulsed CLK 106 signal, where the duration of CLK 106 signal for the evaluation phase (CLK 106 at '1') is shorter than the duration of the CLK 106 signal for the pre-charge phase (CLK 106 at '0').

Embodiments of the circuit may have one or more of the following advantages. Faster transition times and reduced power consumption by the dynamic gates of a pseudo-Nmos circuit.

A number of embodiments of the invention have been described. Nevertheless, it will be understood that various modifications may be made without departing from the spirit and scope of the invention. Accordingly, other embodiments are within the scope of the following claims.

What is claimed is:

1. An integrated circuit comprising:
   domino logic circuits, and
   an intermediate logic circuit having
      an n-block transistor connected to receive a logic signal from a first one of the domino logic circuits and to deliver an evaluated signal to a second one of the domino logic circuits, the n-block transistor also having a source terminal connected to a low ground voltage line that is at a lower voltage than a common ground of the integrated circuit, and
      a delay element connected to receive a delayed control signal and to deliver a time delayed control signal to a logic gate and control an evaluation phase of the n-block transistor.

2. The circuit of claim 1, further comprises:
   a clock signal for controlling pre-charge and evaluation phases of the domino logic circuits.

3. The circuit of claim 2 in which the intermediate logic block further comprises:
   a first pull-up transistor having a gate input to receive the delayed control signal which is derived in reference to the clock signal.

4. The circuit of claim 3 in which the intermediate logic block further comprises:
   an inverter having an input to receive the clock signal, the inverter also having an output to deliver the delayed control signal to the pull-up transistor.

5. The circuit of claim 3, further comprises:
   a logic gate having
      a first input port for receiving the time delayed control signal,
      a second input port for receiving the evaluated signal from the n-block transistor, and an output port for delivering a second control signal to a second pull-up transistor, the second transistor having a gate input for receiving the second control signal.

6. The circuit of claim 5 in which at least one of the first transistor and the second transistor comprises a p-channel transistor.

7. The circuit of claim 3, in which at least one of the domino circuits further comprises a dynamic logic circuit.

8. The circuit of claim 7, in which the dynamic logic circuit comprises:

a first input port to receive the clock signal, a second input port to receive a logic signal, and an output port to deliver a first evaluated signal to the intermediate logic circuit.

9. The circuit of claim 7 in which the clock signal is pulsed and causes an evaluation phase which is shorter than the pre-charge phase for the dynamic circuit.

10. The circuit of claim 7 in which the control signal is pulsed and causes an evaluation phase which is shorter than the pre-charge phase for the intermediate logic block.

11. The circuit of claim 5 in which the logic gate comprises a NOR gate.

12. The circuit of claim 11 in which the NOR gate comprises a CMOS NOR gate.

* * * * *